(12) United States Patent
Etori

(10) Patent No.: US 8,866,177 B2
(45) Date of Patent: Oct. 21, 2014

(54) MICROSTRUCTURE FOR LIGHT-EMITTING ELEMENT, AND LIGHT-EMITTING ELEMENT AND ILLUMINATION DEVICE INCLUDING MICROSTRUCTURE

(75) Inventor: Hideki Etori, Saitama (JP)

(73) Assignee: Kimoto Co., Ltd., Saitama (JP)

( * ) Notice: Subject to any disclaimer, the term of this patent is extended or adjusted under 35 U.S.C. 154(b) by 0 days.

(21) Appl. No.: 13/995,741

(22) PCT Filed: Dec. 20, 2011

(86) PCT No.: PCT/JP2011/079546
§ 371 (c)(1),
(2), (4) Date: Jun. 19, 2013

(87) PCT Pub. No.: WO2012/086651
PCT Pub. Date: Jun. 28, 2012

(65) Prior Publication Data
US 2013/0277664 A1    Oct. 24, 2013

(30) Foreign Application Priority Data

Dec. 21, 2010  (JP) .................................. 2010-284176
Dec. 21, 2010  (JP) .................................. 2010-284177

(51) Int. Cl.
*H01L 33/00*    (2010.01)
*H01L 51/52*    (2006.01)
*F21V 5/00*     (2006.01)
*G02B 1/11*     (2006.01)
*G02B 5/02*     (2006.01)

(52) U.S. Cl.
CPC ........ *H01L 51/5275* (2013.01); *H01L 51/5262* (2013.01); *F21V 5/002* (2013.01); *G02B 1/118* (2013.01); *G02B 5/0294* (2013.01)
USPC .............................................. 257/98; 257/40

(58) Field of Classification Search
USPC ...................................................... 257/98, 40
See application file for complete search history.

(56) References Cited

FOREIGN PATENT DOCUMENTS

| JP | 2005310769 A | 11/2005 |
| JP | 2008140621 A | 6/2008 |
| JP | 2009032463 A | 2/2009 |
| JP | 2009259805 A | 11/2009 |
| JP | 2010123436 A | 6/2010 |
| JP | 2010212204 A | 9/2010 |

OTHER PUBLICATIONS

International Search Report (ISR) for related PCT/JP2011/079546, dated Apr. 10, 2012.

*Primary Examiner* — Douglas Menz
(74) *Attorney, Agent, or Firm* — Bacon & Thomas, PLLC

(57) ABSTRACT

A microstructure for electroluminescent (EL) elements comprises a plurality of microconvexities having circular bottom surfaces. Each microconvexity is defined by a generatrix dropped from the peak to the circumference of the bottom surface. The height of the generatrix is monotonically reduced from the peak to the circumference. The height of the peak may be 0.67-1.15 times the radius of the bottom surface. The height of the convexities at a position on the radius of the bottom surface ¾ away from the center of the bottom surface may be 0.21-0.65 times the radius of the bottom surface. The height of the convexities at a position on the radius of the bottom surface 9/10 away from the center of the bottom surface may be 0.04-0.38 times the radius of the bottom surface.

10 Claims, 8 Drawing Sheets

MICROSTRUCTURE FOR LIGHT-EMITTING ELEMENT, AND LIGHT-EMITTING ELEMENT AND ILLUMINATION DEVICE INCLUDING MICROSTRUCTURE

TECHNICAL FIELD

Background of the Invention

1. Field of the Invention

The present disclosure relates to a microstructure for a light-emitting element such as an EL (electroluminescent) element, a light-emitting element including the microstructure, and an illumination device including the light-emitting element.

2. Background Art

An EL element including an anode (transparent electrode), a light-emitting unit, and a cathode (back electrode) in order has been conventionally known. In the EL element, electrons and holes are injected into the light-emitting unit with application of DC voltage between the anode and the cathode and the electrons and holes are recombined to form excitons, and, by using the emission of light when the exciton is deactivated, the light-emitting unit emits light. Since the EL element has advantages of small weight, small thickness, low power consumption, and the like, the EL element has been used for a flat panel illumination device, an electronic advertising device, a backlight device for a liquid crystal display, or the like.

The members constituting the EL element have a higher refractive index than air. Thus, although having the advantages as described above, the EL element has a problem in which total reflection easily occurs at an interface between the EL element and an air layer when the emitted light exits from the EL element and the light extraction efficiency is less than 20% of the light emitted from the light-emitting unit, so that most light fails to be extracted and lost.

For improving the light extraction efficiency of the EL element, a method has conventionally been suggested in which microscopic uneven patterns are formed on an outermost surface of the EL element via a light-transmitting substrate (for example, see JP-2005-310769A).

According to JP 2005-310769A, a stripe-shaped uneven pattern with a triangular cross section and a stripe-shaped uneven pattern with a semicircular cross section are given as specific uneven patterns, and the luminance in a front direction has been improved as compared with the case not having the uneven patterns.

According to the method described in JP 2005-310769A, the extraction efficiency of the light in a direction parallel to the stripe is not increased. Moreover, since the uneven patterns are stripe-shaped, the light dispersion may become anisotropic and this may cause unevenness of light reflecting the uneven pattern. The convex part with the triangular cross section or the semicircular cross section employed in JP 2005-310769A is not the optimal shape in point of the light extraction efficiency, and the uneven shape for further improving the light extraction efficiency has been desired.

SUMMARY OF THE INVENTION

For solving the above problem, the present inventor has found out that the light extraction efficiency can be improved as compared with the conventional light-emitting element by forming a microstructure including a plurality of convex parts or concave parts with particular shapes for a light-emitting element such as an EL element, and has completed the present disclosure. In this specification, the microstructure refers to a film-like or plate-like member having a microscopic uneven structure on a surface. Incidentally, a state of the microstructure in which the film-like or plate-like member is curved in usage is also included. Further, the present disclosure includes both a convex part pattern (first aspect) including a convex part shape projecting from a reference flat plane of the member and a concave part pattern (second aspect) including a concave part shape depressed from the flat plane. Unless otherwise stated, the following description applies to both the first aspect and the second aspect.

That is, the microstructure for a light-emitting element according to the first aspect of the present disclosure includes a plurality of microscopic convex parts having a convex circular bottom surface. The convex part has a peak on a perpendicular line at a center of the bottom surface and is defined by a generatrix connecting the peak and a circumference of the bottom surface. The generatrix of the convex part is formed by monotonically reducing the height from the peak to the circumference of the bottom surface, and the height of the peak of the convex part is 0.67 to 1.15 times as large as the radius of the bottom surface. The height of the convex part at a position of 3/4 of the radius of the bottom surface from the center of the bottom surface is 0.21 to 0.65 times as large as the radius of the bottom surface. The height of the convex part at a position of 9/10 of the radius of the bottom surface from the center of the bottom surface is 0.04 to 0.38 times as large as the radius of the bottom surface. Note that the height parameter of the peak of the convex part and the height parameters of the convex part at the positions of 3/4 and 9/10 of the radius of the bottom surface from the center of the bottom surface of the convex part are sometimes called "condition 1" collectively below.

In the microstructure for a light-emitting element according to the first aspect of the present disclosure, the height of the convex part at a position of 1/4 of the radius of the bottom surface from the center of the bottom surface is 0.65 to 1.08 times as large as the radius of the bottom surface. The height of the convex part at a position of 1/2 of the radius of the bottom surface from the center of the bottom surface is 0.58 to 0.91 times as large as the radius of the bottom surface. Note that the height parameters of the convex part at the positions of 1/4 and 1/2 of the radius of the bottom surface from the center of the bottom surface of the convex part are sometimes called "condition 2" collectively below.

Moreover, the microstructure for a light-emitting element according to the second aspect of the present disclosure includes a plurality of microscopic concave parts having a circular opening face. The concave part has a bottom on a perpendicular line at a center of the opening face and is defined by a generatrix connecting the bottom and a circumference of the opening face. The generatrix of the concave part is formed by monotonically increasing the depth from the circumference of the opening face to the bottom, and the depth of the bottom of the concave part is 0.65 to 1.43 times as large as the radius of the opening face. The depth of the concave part at a position of 3/4 of the radius of the opening face from the center of the opening face is 0.16 to 0.79 times as large as the radius of the opening face. The depth of the concave part at a position of 9/10 of the radius of the opening face from the center of the opening face is 0.03 to 0.39 times as large as the radius of the opening face. Note that the depth parameter of the bottom of the concave part and the depth parameters of the concave part at the positions of 3/4 and 9/10 of the radius of the opening face from the center of the opening face of the concave part are sometimes called "condition 3" collectively below.

In the microstructure for a light-emitting element according to the second aspect of the present disclosure, the depth of the concave part at a position of ¼ of the radius of the opening face from the center of the opening face is 0.64 to 1.35 times as large as the radius of the opening face. The depth of the concave part at a position of ½ of the radius of the opening face from the center of the opening face is 0.58 to 1.11 times as large as the radius of the opening face. Note that the depth parameters of the concave part at the positions of ¼ and ½ of the radius of the opening face from the center of the opening face of the concave part are sometimes called "condition 4" collectively below.

In the microstructure for a light-emitting element according to the present disclosure, the filling factor of the bottom surface of the convex part or the opening face of the concave part to the surface of the microstructure is 70% or more.

In the microstructure for a light-emitting element according to the first aspect of the present disclosure, the angle between a tangential line of the generatrix of the convex part and the bottom surface of the convex part at a position where the bottom surface of the convex part and the generatrix of the convex part are in contact with each other is preferably 85° or less. Similarly, in the microstructure for a light-emitting element according to the second aspect of the present disclosure, the angle between a tangential line of the generatrix of the concave part and the opening face of the concave part at a position where the opening face of the concave part and the generatrix of the concave part are in contact with each other is preferably 85° or less.

In the microstructure for a light-emitting element according to the present disclosure, a member with a flat surface is preferably disposed on the convex part or the concave part.

A light-emitting element according to the present disclosure includes a transparent anode, a light-emitting unit, and a cathode in order. The microstructure for a light-emitting element according to the present disclosure is disposed on a side of the transparent anode opposite to a side thereof provided with the light-emitting unit, so that the uneven pattern (the peak of the convex part or the opening face of the concave part) is on a light emission plane side. Preferably, the light-emitting element can be used as a light source of an illumination device.

According to the present disclosure, a plurality of convex parts or concave parts with particular shapes is included in the microstructure for a light-emitting element, and thus, the light extraction efficiency can be improved as compared with the conventional light-emitting element. In the case of the convex part, the light extraction efficiency is particularly excellent. In the case of the concave part, the microstructure can have excellent durability.

DETAILED DESCRIPTION OF PREFERRED EMBODIMENTS

First, an embodiment of a microstructure for a light-emitting element of the present disclosure (hereinafter also called "microstructure") will be described.

<Uneven Pattern>

There are two aspects of the uneven pattern of the microstructure of the present disclosure. One is an uneven pattern (first aspect) including a plurality of convex parts projecting from a reference flat plane of the microstructure, while the other is an uneven pattern (second aspect) including a plurality of concave parts depressed from the flat plane. The characteristics of the uneven pattern will be described below for each aspect.

<<First Aspect>>

The microstructure for a light-emitting element according to the first aspect includes a plurality of microscopic convex parts having a circular bottom surface. The convex part has a peak on a perpendicular line at a center of the bottom surface, and is defined by a generatrix connecting the peak and a circumference of the bottom surface. The generatrix of the convex part is formed by monotonically reducing the height from the peak to the circumference of the bottom surface, and the height of the peak of the convex part is 0.67 to 1.15 times as large as the radius of the bottom surface. The height of the convex part at a position of ¾ of the radius of the bottom surface from the center of the bottom surface is 0.21 to 0.65 times as large as the radius of the bottom surface. The height of the convex part at a position of 9/10 of the radius of the bottom surface from the center of the bottom surface is 0.04 to 0.38 times as large as the radius of the bottom surface.

Since the microstructure for a light-emitting element according to the first aspect has the aforementioned special surface shape, the use of the microstructure for a light-emitting element can improve the light extraction efficiency as compared with the conventional light-emitting element.

Figure 1:
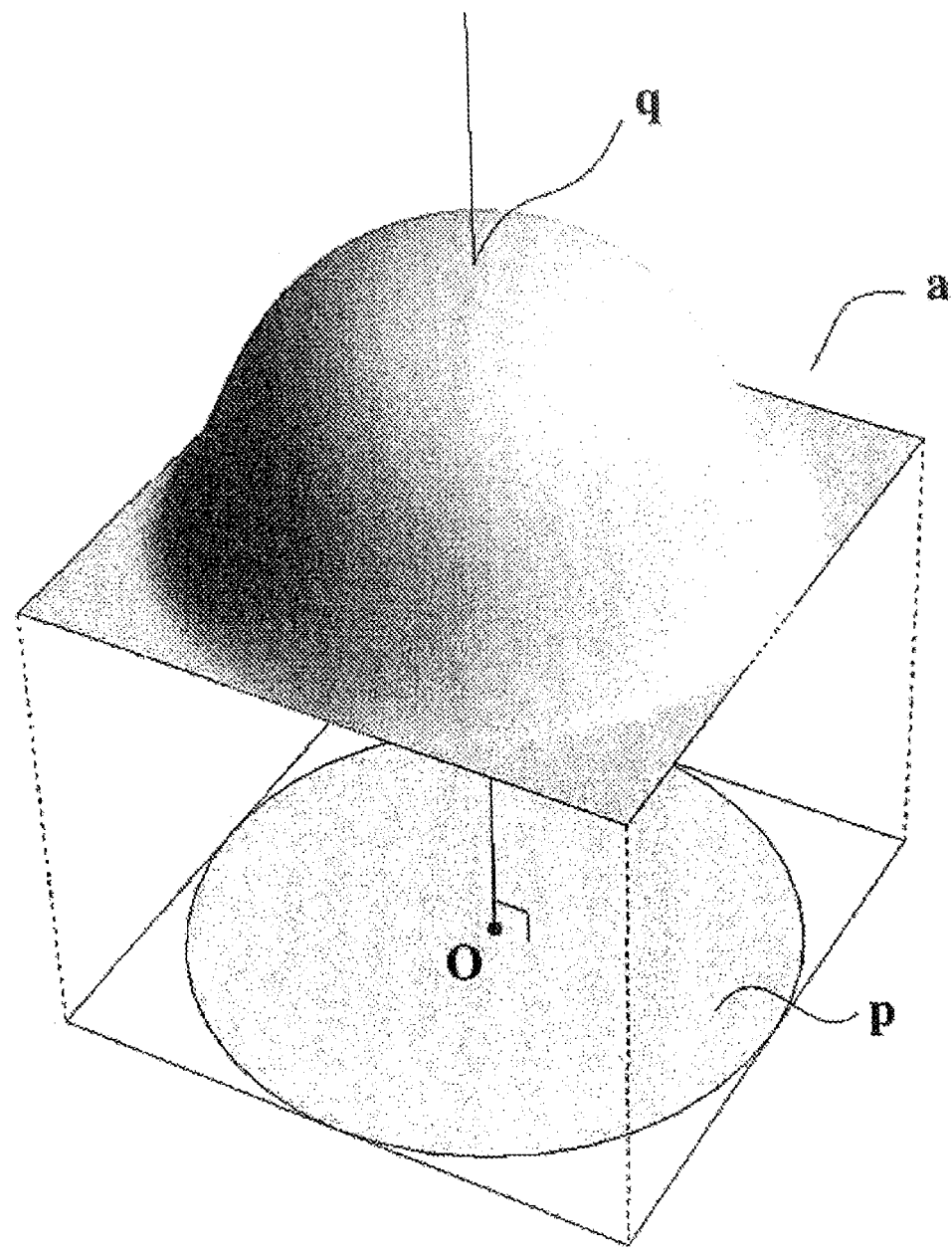
FIG. 1 is a perspective view of a convex part included in a microstructure according to the first aspect of the present disclosure.

As depicted in FIG. 1, plural convex parts a included in the microstructure of the first aspect each have a circular bottom surface p and a peak q on a perpendicular line at a center o of the bottom surface p, and are defined by a generatrix connecting the peak q and a circumference of the bottom surface p.

The generatrix of the convex part a is formed by monotonically reducing the height from the peak q to the circumference of the bottom surface p.

The shape of the convex part included in the microstructure of the first aspect is obtained by performing optical simulation in which the radius, height, shape of the generatrix, and the like of the convex part are changed variously, and extracting the range allowing preferable light extraction efficiency.

Figure 2:
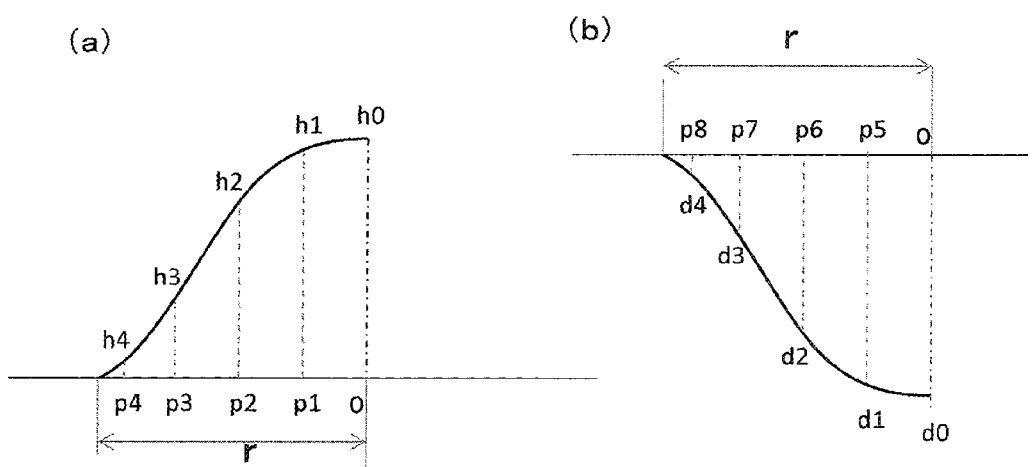
FIG. 2(a) depicts the shape of a generatrix of a convex part.
FIG. 2(b) depicts the shape of a generatrix of a concave part.

Specifically, as depicted in FIG. 2(a), the radius r of the convex part is assumed as 1 and a body of rotation with various heights and different shapes of the generatrix is assumed as a virtual convex part. Note that the shape of the generatrix is the shape formed by connecting the center o of a bottom surface of the body of rotation and the heights at four points with different distances from the center o: p1 (at a position of ¼ of the radius); p2 (at a position of ½ of the radius); p3 (at a position of ¾ of the radius); and p4 (at a position of 9/10 of the radius) (the heights are h0, h1, h2, h3, and h4, respectively) with a cubic spline curve.

As the virtual convex part, such a shape is assumed that the radius r of the convex part is 1.00 and h0 to h4 are varied ranging from 0.00 to 2.00. The light extraction efficiency is calculated by initially changing the increment among h0 to h4 by 0.50 each. In this stage, as for the h0 to h4 with high extraction efficiency, the increment is changed minutely by 0.20 each and by 0.10 each and finally by 0.01 each to calculate the light extraction efficiency.

Figure 3:
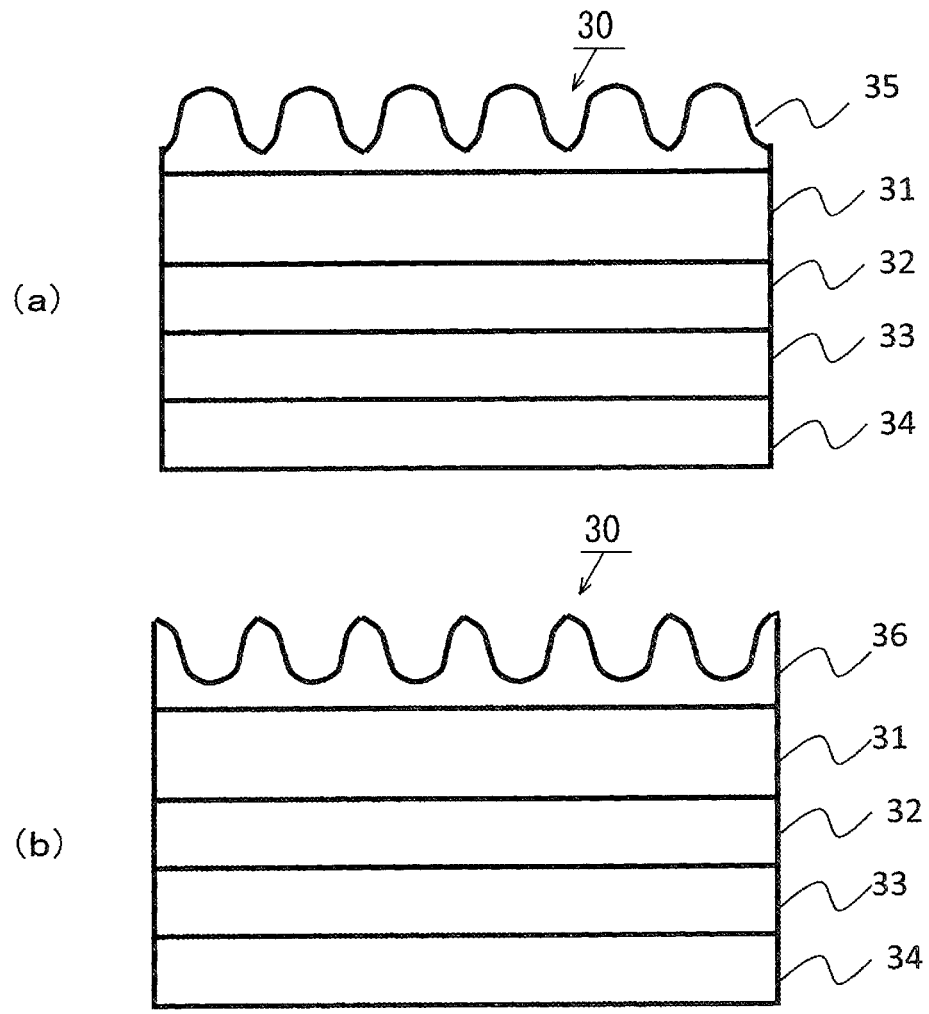
FIGS. 3(a) and 3(b) depict configurations of light-emitting elements used in simulation of the present disclosure.

For calculating the extraction efficiency, a light-emitting element 30 having a microstructure 35 with a configuration in which a light-emitting layer 33 is held between a glass 31 and a transparent electrode 32, and an aluminum electrode (mirror reflection layer) 34 as depicted in FIG. 3(a), and the virtual convex parts are disposed on lattice points whose cycle corresponds to the diameter of the convex part on the glass surface (light extraction surface) is assumed as the light-emitting element. The light-emitting layer 33 is assumed as a group of point light sources emitting light with the same intensity in all the directions.

In the simulation, the paths of light traveling from the point light sources in all the directions are calculated using a ray-tracing method, and the proportion of light emitted from one convex part in the assumed light-emitting element is estimated as the light extraction efficiency E. In the calculation of the ray tracing method, the refractive indices of the light-emitting layer 33, the transparent electrode 32, the glass 31, and the microstructure 35 are assumed as typical values: light-emitting layer, 1.70; transparent electrode, 2.00; glass, 1.51; and microstructure, 1.58. The light extraction efficiency E0 in the case where a structure with a flat light extraction plane is assumed instead of the microstructure 35 is similarly calculated, and the range where the light extraction efficiency E of the light extraction plane with the convex part is 2.26 times or more the light extraction efficiency E0 in the case where the light extraction plane is flat is assumed as the range of the convex shape. In the case where the convex part has a hemispherical shape, the light extraction efficiency improves 2.25 times as compared with the case where the light extraction plane is flat. The shape improving the light extraction efficiency more than that is employed as the shape in this embodiment. The similar results are obtained even when the refractive indices are varied in the range of the general material for each component.

The results of the above simulation proves that, when the height of the peak of the convex part is 0.67 to 1.15 times as large as the radius of the bottom surface, the light extraction efficiency is improved by 2.26 times or more as compared with the case in which the light emission plane is flat. The preferable height of the peak is 0.70 to 1.07 times as large as the radius of the bottom surface, and the more preferable height thereof is 0.80 to 1.00 times. The height of the convex part at the position of ¾ of the radius of the bottom surface from the center of the bottom surface is 0.21 to 0.65 times, preferably 0.25 to 0.63 times, and more preferably 0.37 to 0.53 times as large as the radius of the bottom surface. The height of the convex part at the position of 9/10 of the radius of the bottom surface from the center of the bottom surface is 0.04 to 0.38 times, preferably 0.05 to 0.35 times, and more preferably 0.08 to 0.20 times as large as the radius of the bottom surface.

The convex part is unlike the hemispherical shape, and the radius of curvature of each part of the generatrix of the convex part is not constant, which is different from a semicircle. Although the simulation is performed on the convex part as the body of rotation obtained by rotating one generatrix along the axis perpendicular to the center of the bottom surface, the convex part is not necessarily the body of rotation as long as the above condition is satisfied.

As for the shape of the convex part, it is preferred that the height of the convex part at the position of ¼ of the radius of the bottom surface from the center of the bottom surface is 0.65 to 1.08 times, preferably 0.67 to 1.04 times, and more preferably 0.77 to 0.93 times as large as the radius of the bottom surface. Moreover, the height of the convex part at the position of ½ of the radius of the bottom surface from the center of the bottom surface is 0.58 to 0.91 times, preferably 0.63 to 0.88 times, and more preferably 0.66 to 0.83 times as large as the radius of the bottom surface.

Figure 4:
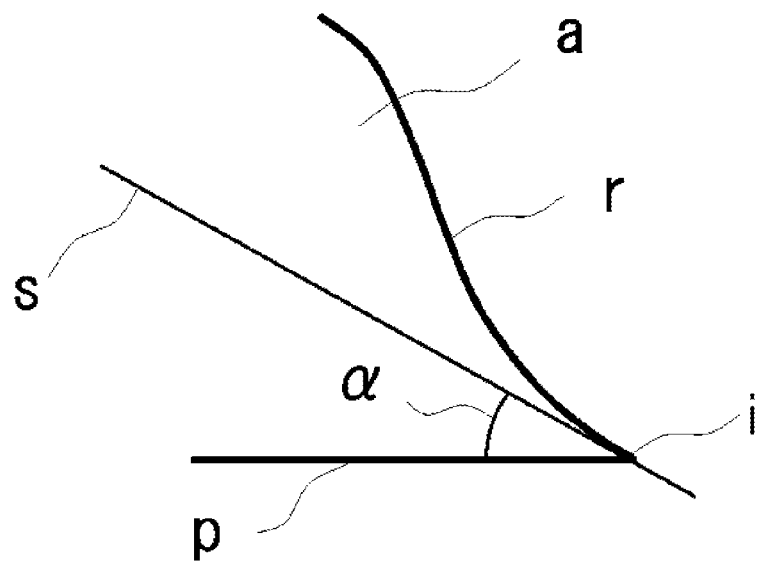
FIG. 4 is an explanatory view depicting the angle between a tangential line of the generatrix of the convex part and a bottom surface of the convex part at a position where the generatrix of the convex part and the bottom surface of the convex part of the microstructure of the first aspect of the present disclosure are in contact with each other.

The angle between a tangential line of the generatrix of the convex part and the bottom surface of the convex part at a position where the bottom surface of the convex part and the generatrix of the convex part are in contact with each other is preferably 85° or less and more preferably 80° or less. Note that the angle when the convex part has a hemispherical shape is 90°. FIG. 4 depicts the angle α between the tangential line of the generatrix r of the convex part a and the bottom surface p of the convex part a at a position i where the bottom surface p of the convex part a and the generatrix r of the convex part a are in contact with each other.

The filling factor of the bottom surface of the convex part to the surface of the microstructure of the first aspect is preferably 70% or more, more preferably 80% or more, much more preferably 85% or more, and particularly preferably 90% or more, from the viewpoint of improving the light extraction efficiency. The size or the height of the convex part in the microstructure may be different as long as the numerical range of the shape specified in the present disclosure is satisfied.

The convex parts are preferably randomly arranged from the viewpoint of suitably preventing moire that would occur due to the stack of another member having a regular structure. On the other hand, the convex parts are preferably arranged regularly from the viewpoint of facilitating the arrangement of the convex parts and improving the filling factor with circles having the same radius. The regular arrangement may be a lattice, a honeycomb, or the like.

The diameter of the bottom surface of the convex part of the microstructure of the first aspect is preferably 1 to 100 μm, and more preferably 3 to 50 μm. By setting the upper limit thereof at 100 μm or less, the particulate sense of the convex part due to the arrangement pattern of the convex parts can be eliminated and a uniform surface can be obtained. By setting the lower limit at 1 μm or more, the light extraction efficiency can be prevented from deteriorating.

Figure 5:
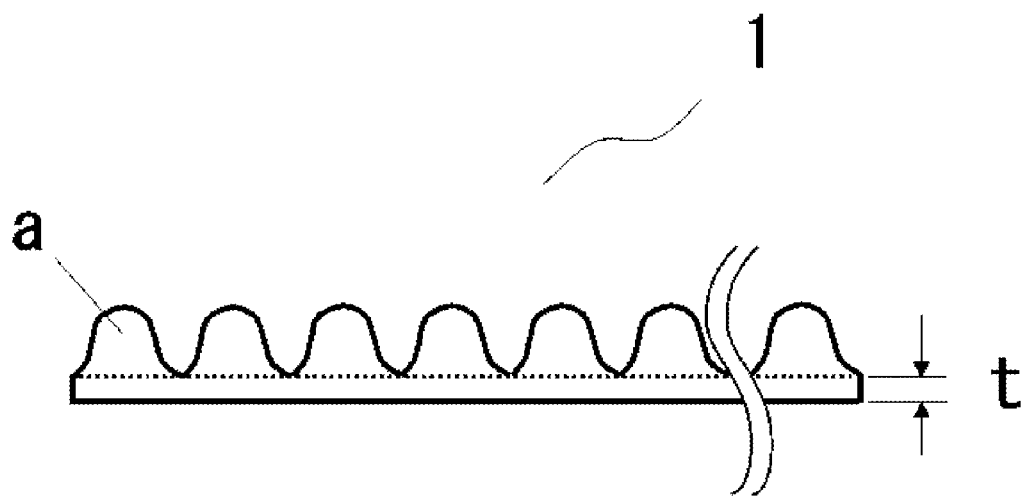
FIG. 5 is a schematic sectional view depicting an embodiment of the microstructure of the first aspect of the present disclosure.

The thickness of a base part that supports the convex part of the microstructure of the first aspect is preferably 300 µm or less, and more preferably 100 µm or less. When the thickness is 300 µm or less, the crack or curving can be prevented. The lower limit of the thickness of the base part is preferably 1 µm or more. By setting the thickness of the base part at 1 µm or more, the interference unevenness can be prevented. Here, "the thickness of the base part that supports the convex part of the microstructure" refers to, as depicted in FIG. 5, a thickness t from a plane provided with the bottom surface of the convex part a to a plane opposite thereto.

<<Second Aspect>>

Next, the microstructure for a light-emitting element according to the second aspect will be described. The microstructure for a light-emitting element according to the second aspect includes a plurality of microscopic concave parts having a circular opening face. The concave part has a bottom on a perpendicular line at a center of the opening face, and is defined by a generatrix connecting the bottom and a circumference of the opening face. The generatrix of the concave part is formed by monotonically increasing the depth from the circumference of the opening face to the bottom, and the depth of the bottom of the concave part is 0.65 to 1.43 times as large as the radius of the opening face. The depth of the concave part at a position of ¾ of the radius of the opening face from the center of the opening face is 0.16 to 0.79 times as large as the radius of the opening face. The depth of the concave part at a position of 9/10 of the radius of the opening face from the center of the opening face is 0.03 to 0.39 times as large as the radius of the opening face.

Since the microstructure for a light-emitting element according to the second aspect has the aforementioned special surface shape, the use of the microstructure for a light-emitting element can improve the light extraction efficiency as compared with the conventional light-emitting element.

Figure 6:
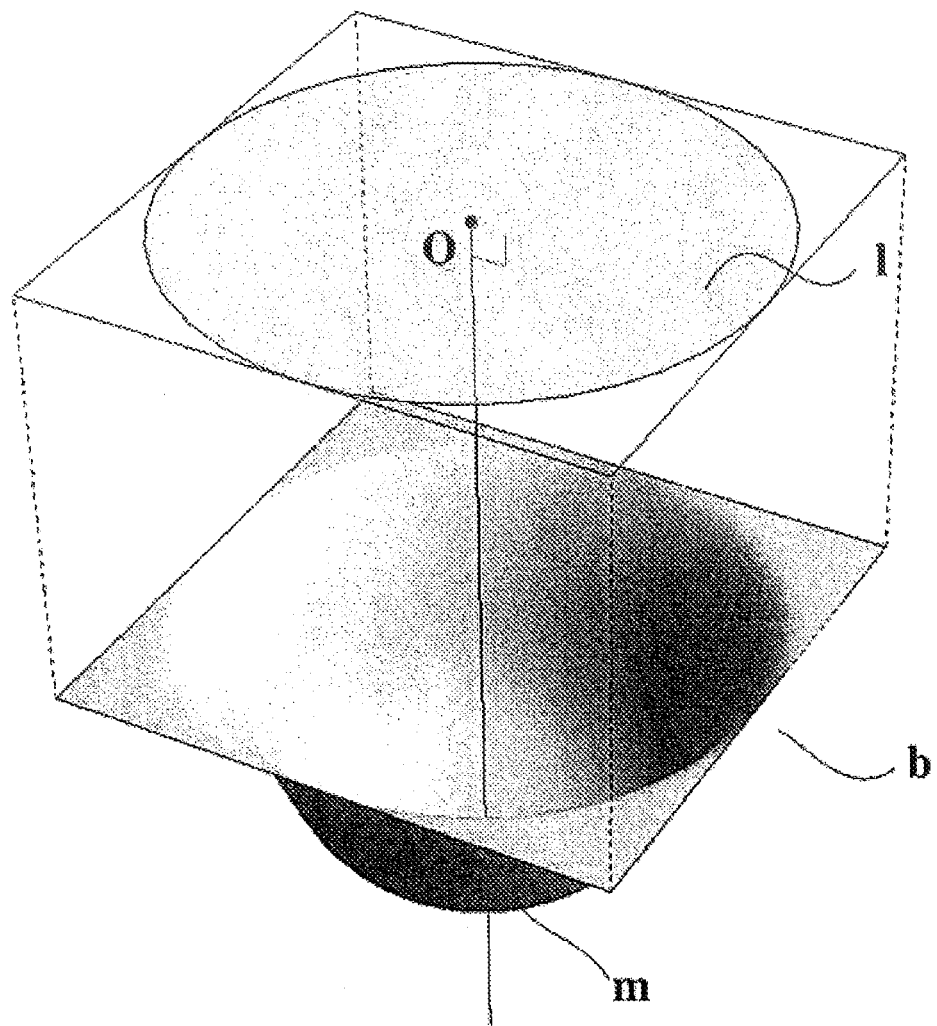
FIG. 6 is a perspective view depicting a concave part included in the microstructure of the second aspect of the present disclosure.

As depicted in FIG. 6, plural concave parts b included in the microstructure of the second aspect each have a circular opening face 1 and have a bottom m on a perpendicular line at a center o of the opening face 1, and are defined by a generatrix connecting the bottom m and a circumference of the opening face 1. The generatrix of the concave part b is formed by monotonically increasing the depth from the circumference of the opening face 1 to the bottom m.

The shape of the concave part included in the microstructure of the second aspect is obtained by performing optical simulation in which the radius of the opening surface, depth of the bottom, shape of the generatrix, and the like of the concave part are changed variously, and extracting the range allowing preferable light extraction efficiency.

Specifically, as depicted in FIG. 2(b), the radius of the opening face of the concave part is assumed as 1 and a body of rotation with various depths and different shapes of the generatrix is assumed as a virtual concave part. Note that the shape of the generatrix is the shape formed by connecting the center o of the opening face and the depths at four points with different distances from the center o: p5 (at a position of ¼ of the radius); p6 (at a position of ½ of the radius); p7 (at a position of ¾ of the radius); and p8 (at a position of 9/10 of the radius) (the depths are d0, d1, d2, d3, and d4, respectively) with a cubic spline curve.

As the virtual concave part, such a shape is assumed that the radius of the opening face of the concave part is 1.00 and d0 to d4 are varied ranging from 0.00 to 2.00. The light extraction efficiency is calculated by initially changing the increment among d0 to d4 by 0.50 each. In this stage, as for d0 to d4 with high extraction efficiency, the increment is changed minutely by 0.20 each and by 0.10 each and finally by 0.01 each to calculate the light extraction efficiency.

For calculating the extraction efficiency, a light-emitting element with a similar configuration to that when the convex part is simulated (FIG. 3(b)) is assumed as the light-emitting element 30, and a microstructure 36 with a configuration in which the virtual concave parts are disposed on lattice points whose cycle corresponds to the diameter of the concave part on a glass surface (light extraction plane) 31. Thus, the simulation similar to that performed on the convex part is performed using the ray tracing method, and the range where the light extraction efficiency of the light extraction plane with the concave part is 2.25 times or more the light extraction efficiency in the case where the light extraction plane is flat is set as the range of the concave shape. In the case where the concave part has a hemispherical shape, the light extraction efficiency is improved by 2.24 times as compared with the case where the light extraction plane is flat. The range allowing the improvement of the light extraction efficiency more than the case of the hemispherical shape is employed as the shape in this embodiment.

The results of the above simulation proves that, when the depth of the bottom of the concave part is 0.65 to 1.43 times as large as the radius of the opening face, the light extraction efficiency is improved by 2.25 times or more as compared with the case where the light emission plane is flat. The depth of the bottom of the concave part is preferably 0.75 to 1.38 times, and more preferably 0.81 to 1.25 times. The depth of the concave part at the position of ¾ of the radius of the opening face from the center of the opening face is 0.16 to 0.79 times, preferably 0.24 to 0.58 times, and more preferably 0.34 to 0.53 times as large as the radius of the opening face. The depth of the concave part at the position of 9/10 of the radius of the opening face from the center of the opening face is 0.03 to 0.39 times, preferably 0.04 to 0.28 times, and more preferably 0.07 to 0.23 times as large as the radius of the opening face.

The shape of a hollow part defined by the opening face of the concave part and the generatrix of the concave part is different from the hemispherical shape, and the radius of curvature of each part of each generatrix is not constant differently from a semicircle. Although the simulation is performed on the concave part as the body of rotation obtained by rotating one generatrix along the axis perpendicular to the center of the bottom surface, the concave part is not necessarily the body of rotation as long as the above condition is satisfied.

As for the concave shape, it is preferred that the depth of the concave part at the position of ¼ of the radius of the opening face from the center of the opening face is 0.64 to 1.35 times, preferably 0.74 to 1.25 times, and more preferably 0.78 to 1.17 times as large as the radius of the opening face. Moreover, the depth of the concave part at the position of ½ of the radius of the opening face from the center of the opening face is 0.58 to 1.11 times, preferably 0.65 to 0.97 times, and more preferably 0.67 to 0.95 times as large as the radius of the opening face.

Figure 7:
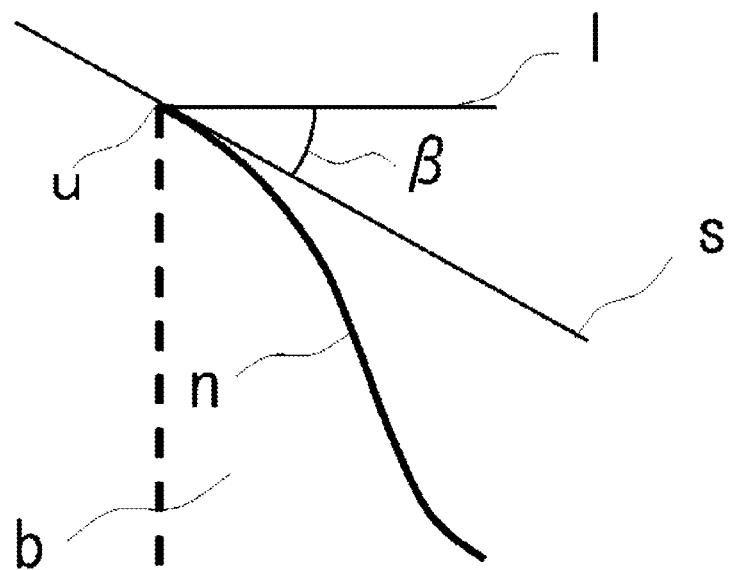
FIG. 7 is an explanatory view depicting the angle between a tangential line of the generatrix of the concave part and an opening face of the concave part at a position where the generatrix of the concave part and the opening face of the concave part of the microstructure of the second aspect of the present disclosure are in contact with each other.

The angle between a tangential line of the generatrix of the concave part and the opening face of the concave part at a position where the opening face of the concave part and the generatrix of the concave part are in contact with each other is preferably 85° or less and more preferably 80° or less. Note that the angle when the hollow part of the concave part has a hemispherical shape is 90°. FIG. 7 depicts the angle 13 between the tangential line s of the generatrix n of the concave part b and the opening face 1 of the concave part b at a position u where the opening face 1 of the concave part b and the generatrix n of the concave part b are in contact with each other.

The filling factor of the opening face of the concave part to the surface of the microstructure of the second aspect is preferably 70% or more, more preferably 80% or more, much more preferably 85% or more, and particularly preferably 90% or more, from the viewpoint of improving the light extraction efficiency. The size or the depth of the bottom of the concave part in the microstructure may be different as long as the numerical range of the shape specified in the present disclosure is satisfied.

The concave parts are preferably randomly arranged from the viewpoint of suitably preventing moire that would occur due to the stack of another member having a regular structure. On the other hand, the concave parts are preferably arranged regularly from the viewpoint of facilitating the arrangement of the concave parts and improving the filling factor with circles having the same radius. The regular arrangement may be a lattice, a honeycomb, or the like.

The diameter of the opening face of the concave part of the microstructure of the second aspect is preferably 1 to 100 µm, and more preferably 3 to 50 µm. By setting the upper limit thereof at 100 µm or less, the particulate sense of the concave part due to the arrangement pattern of the concave parts can be eliminated and a uniform surface can be obtained. By setting the lower limit at 1 µm or more, the light extraction efficiency can be prevented from deteriorating.

Figure 8:
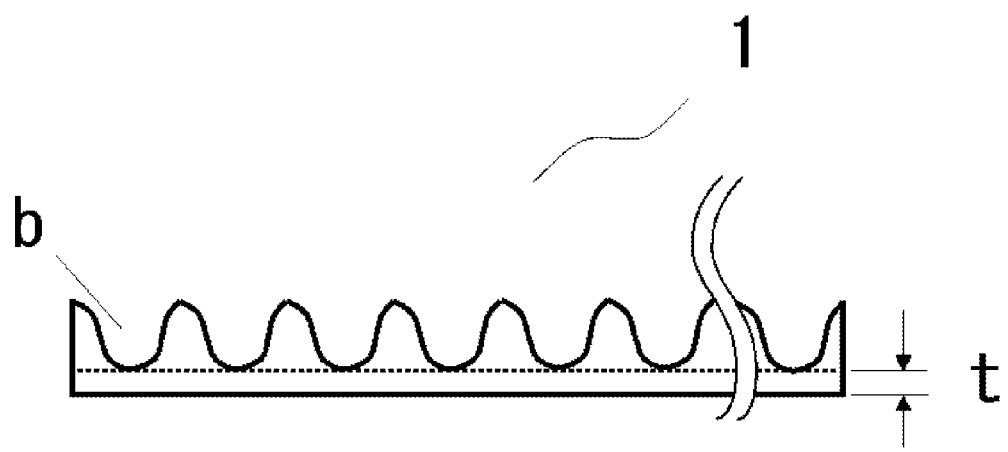
FIG. 8 is a schematic sectional view depicting an embodiment of the microstructure of the second aspect of the present disclosure.

The thickness of a base part that supports the concave part of the microstructure of the second aspect is preferably 300 µm or less, and more preferably 100 µm or less. When the upper limit is 300 µm or less, the crack or curving can be prevented. The lower limit of the thickness of the base part is preferably 0.2 µm or more. By setting the thickness of the base part at 0.2 µm or more, the durability that allows sufficient resistance in usage can be obtained. Here, "the thickness of the base part that supports the concave part of the microstructure" refers to, as depicted in FIG. 8, a thickness t from a plane provided with the bottom of the concave part b to a plane opposite thereto.

<Material of Microstructure>

Next, the material of the microstructure common to the first and second aspects will be described. The microstructure according to the present disclosure is formed using a transparent polymer resin. Such a polymer resin includes an ionizing radiation curable resin, a thermosetting resin, a thermoplastic resin, and the like.

As the ionizing radiation curable resin, a photopolymerization prepolymer capable of crosslinking and curing with ionizing radiation (with a UV beam or an electron beam) can be used. As this photopolymerization prepolymer, an acrylic-based prepolymer which has a three-dimensional mesh structure by crosslinking and curing and has two or more acryloyl groups in one molecule is particularly preferably used. The acrylic-based prepolymer includes urethane acrylate, polyester acrylate, epoxy acrylate, melamine acrylate, polyfluoroalkyl acrylate, silicone acrylate, and the like. Any of these acrylic based prepolymer can be used alone, but a photopolymerization monomer is preferably added for further improving the hardness of a lens layer by improving the cross-linking and curing properties.

As the photopolymerization monomer, one kind of or two or more kinds of the following are used: a monofunctional acrylic monomer such as 2-ethyl hexyl acrylate, 2-hydroxyethyl acrylate, 2-hydroxypropyl acrylate, or butoxy ethyl acrylate; a difunctional acrylic monomer such as 1,6-hexane diol diacrylate, neopentyl glycol diacrylate, diethylene glycol diacrylate, polyethylene glycol diacrylate, or hydroxy pivalate ester neopentyl glycol diacrylate; and a multifunctional acrylic monomer such as dipentaerythritol hexaacrylate, trimethyl propane triacrylate, or pentaerythritol triacrylate.

In the case of curing with UV ray irradiation, an additive such as a photopolymerization initiator or a photopolymerization promoter is preferably used in addition to the photopolymerization prepolymer and the photopolymerization monomer described above.

As the photopolymerization initiator, acetophenone, benzophenone, Michler ketone, benzoin, benzyl methylketal, benzoylbenzoate, α-acyloxime ester, thioxanthones, or the like is given.

The photopolymerization promoter can accelerate the curing speed by reducing the defective polymerization due to the air at the time of curing, and for example, p-dimethyl aminobenzoate isoamylester, p-dimethyl aminobenzoate ethyl ester, or the like is given as the photopolymerization promoter.

As the thermosetting resin, a silicone-based resin, a phenol-based resin, a urine-based resin, a melamine-based resin, a furan-based resin, an unsaturated polyester-based resin, an epoxy-based resin, a diarylphthalate-based resin, a guanamine-based resin, a ketone-based resin, an aminoalkyd-based resin, a urethane-based resin, an acrylic-based resin, a polycarbonate-based resin, and the like are given. Any of these resins can be used alone, but a curing agent is desirably added for improving the cross-linking property and the hardness of the cross-linking curing coated film.

As the curing agent, a compound such as polyisocyanate, an amino resin, an epoxy resin, or a carboxylic acid can be used as appropriate in accordance with a suitable resin.

As the thermoplastic resin, an ABS resin, a norbornene resin, a silicone-based resin, a nylon-based resin, a polyacetal-based resin, a polycarbonate-based resin, a modified polyphenylene ether resin, polybutylene terephthalate, polyethylene terephthalate, a sulfone-based resin, an imide-based resin, a fluorine-based resin, a styrene-based resin, an acrylic-based resin, a vinyl chloride-based resin, a vinyl acetate-based resin, a vinyl chloride-vinyl acetate copolymer-based resin, a polyester-based resin, a urethane-based resin, a nylon-based resin, a rubber-based resin, polyvinyl ether, polyvinyl alcohol, polyvinyl butyral, polyvinyl pyrrolidone, polyethylene glycol, and the like are given.

Note that, among these thermosetting resins and thermoplastic resins, the thermosetting resin or the thermoplastic resin of the acrylic-based resin is preferably used from the viewpoint of achieving the strength of the coated film of the microstructure or the favorable transparency. The thermosetting resin or the thermoplastic resin can be used as a composite resin in which a plurality of thermosetting resins or a plurality of thermoplastic resins is combined.

As the polymer resin, a resin other than the aforementioned resins can be used. However, for accurately fabricating the microstructure of the present disclosure, the content proportion between the aforementioned polymer resin and the other resins is preferably as follows: when the microstructure is fabricated by a Photo-Polymer method (2P method) as described later, the ionizing radiation curable resin is preferably contained by approximately 30 to 90 wt. % in all the polymer resin compositions; on the other hand, when the microstructure is fabricated by a Thermal-Transformation method (2T method) or an emboss process method, the thermosetting resin or the thermoplastic resin is preferably contained by approximately 30 to 90 wt. % in all the polymer resin compositions.

Note that, in addition to the polymer resin, the microstructure may include various additives such as a particle, a lubricant, a fluorescent whitening agent, an anti-static agent, a retardant, an antibacterial, a fungicide, a UV absorber, an optical stabilizer, an antioxidant, a plasticizing agent, a leveling agent, a flow adjusting agent, an anti-foaming agent, a dispersant, a separation agent, a crosslinking agent, or the like as long as the effect of the present disclosure is not interrupted. The refractive index of the microstructure is preferably 1.40 to 1.70 and more preferably 1.50 to 1.65.

Example of Modification

The microstructure of the present disclosure can be variously modified, and a member can be added or replaced based on the configuration depicted in FIG. 5 and FIG. 8. The example of modification will be described below.

Figure 9:
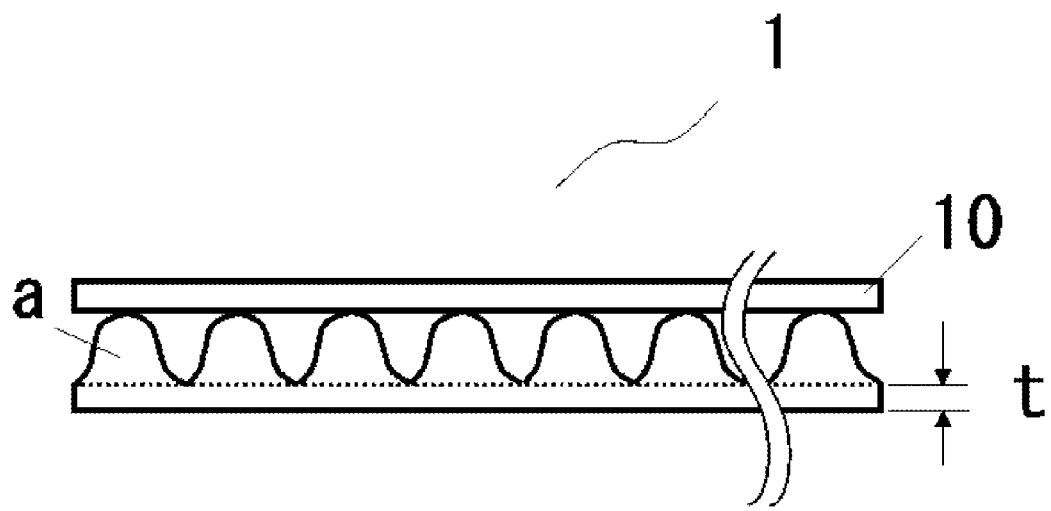
FIG. 9 is a schematic sectional view depicting another embodiment of the microstructure of the first aspect of the present disclosure.

A surface of the microstructure of the present disclosure having an uneven pattern thereon is preferably provided with a member having a flat surface. In the microstructure according to the first aspect, the provision of the flat member on the surface of the peak side of the convex part can protect the convex part and prevent the decrease in light extraction efficiency, which is caused due to the change in shape of the convex shape from scratch or the like, or prevent the fall of the convex part, and can allow easy removal of a foreign substance attached on the surface. FIG. 9 depicts the microstructure 1 according to the present disclosure in which a flat member 10 is disposed on the surface of the peak side of the convex part a.

Figure 10:
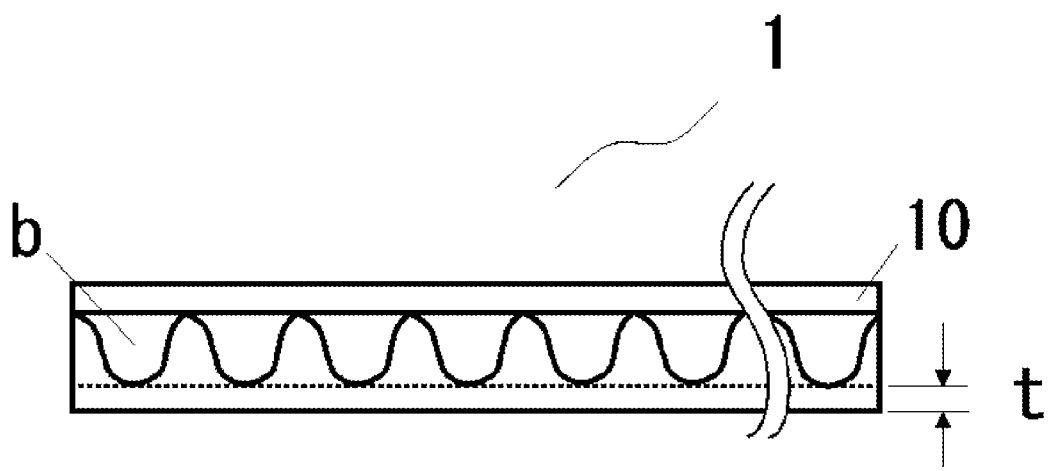
FIG. 10 is a schematic sectional view depicting another embodiment of the microstructure of the second aspect of the present disclosure.

Moreover, in the microstructure according to the second aspect, the provision of the flat member on the opening face of the concave part can prevent the decrease in light extraction efficiency, which is caused due to the clogging of the concave part with a foreign substance or the like, or prevent a defect on the opening face of the concave part, and allow easy removal of a foreign substance attached on the surface. FIG. 10 depicts the microstructure 1 according to the present disclosure in which the flat member 10 is disposed on the opening face of the concave part b.

The flat member may be similar to those given as a supporter to be later described. The thickness of the flat member is preferably 25 to 500 μm.

The flat member may be attached by a known adhesive for improving the adhesion with the microstructure.

A surface of the flat member on the side opposite to the side thereof provided for the microstructure may be provided with a hard coat layer from the viewpoint of preventing the damage or improving the durability.

The hard coat layer is formed of a resin such as an ionizing radiation curable resin, a thermosetting resin, or a thermoplastic resin. Above all, the ionizing radiation curable resin is preferably used because the hard-coatability is excellent. These resins may be similar resins to the ionizing radiation curable resin, the thermosetting resin, the thermoplastic resin, and the like applicable to the microstructure as described above.

The thickness of the hard coat layer is preferably 0.1 μm to 30 μm, more preferably 0.5 to 15 μm, and much more preferably 2 μm to 10 μm. By setting the thickness of the hard coat layer at 0.1 μm or more, the hard-coatability can be made sufficient. When the hard coat layer has a thickness of 30 μm or less, the occurrence of curving or the lack of hardness can be prevented.

The hard coat layer preferably has a pencil scratching hardness value (pencil hardness) of H or more, more preferably 2 H or more, and much more preferably 3 H or more. By adjusting the pencil scratching hardness value at or above a predetermined value, the scratch of the surface of the hard coat layer can be effectively prevented. Note that the pencil scratching hardness value is the value measured by a method based on JIS K5400: 1990. The scratch tolerance or the hardness of the hard coat layer can be adjusted based on the kind of the resin included in the hard coat layer or the curing condition of the resin.

The hard coat layer can be formed on the flat member in a manner such that: a resin such as the aforementioned ionizing radiation curable resin, an additive, a dilution solvent, or the like is mixed as necessary to prepare the application liquid for the hard coat layer; the liquid is applied by a known coating method such as a bar coater, a die coater, a blade coater, a spin coater, a roll coater, a gravure coater, a flow coater, a spray, or a screen printing; drying is performed as necessary; and an ionizing radial ray is delivered to cure the ionizing radiation curable resin.

The microstructure according to the present disclosure may be formed on a supporter.

The supporter may have high transparency, such as a glass plate or a plastic film. The glass plate may be, for example, a plate of oxide glass such as silicate glass, phosphate glass, or borate glass. In particular, a plate of silicate glass such as silicate glass, alkali silicate glass, soda lime glass, potash lime glass, lead glass, barium glass, or borosilicate glass is preferable. The plastic film may be formed of, for example, polyethylene terephthalate, polybutylene terephthalate, polyethylene naphthalate, polycarbonate, polyethylene, polypropylene, polystyrene, triacetyl cellulose, acrylic, polyvinyl chloride, a norbornene compound, or the like. A polyethylene terephthalate film, which is stretched, especially biaxially stretched, is suitably used for its features of excellent mechanical strength and dimensional stability. Preferably, such a supporter has been subjected to easy-adhesion processing, such as plasma processing, corona discharging processing, far-UV irradiation processing, or formation of an undercoating easy-adhesion layer.

The thickness of the supporter is not particularly limited and can be selected as appropriate in accordance with the material to be applied. Generally, the thickness is 25 to 500 μm and preferably 50 to 300 μm.

The supporter may be provided with an easy-adhesion layer on a film surface or be subjected to corona discharging processing, plasma processing, far-IR processing, or the like for improving the adhesion with the microstructure.

<Fabrication Method>

A method for fabricating the microstructure according to the present disclosure will be described below. The microstructure according to the present disclosure can be formed by a transcription and incorporation technique such as the 2P method, the 2T method, or an emboss process method. Thus, first, a mold for forming a desired uneven pattern is prepared. The mold can be directly formed of a heat-resistant material such as metal or formed through electroforming. In any case, first, a flat surface is filled with a plurality of circles with constant radius or with various radiuses and the position of a bottom surface of the convex part or the opening face of the concave part is determined. As for the method of disposing the circles at a desired filling factor, a method according to Domestic re-publication of PCT international application WO2009/116429 can be employed, for example. Next, the numerical value satisfying condition 1 or condition 3 is set as the height of the convex part, the depth of the concave part, and the shape of the generatrix with the circle as a bottom surface, by using the radius of each circle. Up to this calculation can be performed by a calculator, and this determines the shape of the convex part. Next, the designed concave part is formed, for example, into the mold material according to the micromachining technique such as photolithography, micro-cutting processing, or etching. For controlling the shape in the photolithography, for example, the technique disclosed in Domestic re-publication of PCT international application WO2007/040138 or Domestic re-publication of PCT international application WO2007/116671 can be used. For the micro-cutting processing, the convex part with a desired shape can be fabricated by using a drill with a shape of an edge corresponding to the shape of the determined generatrix.

As for the microstructure according to the first aspect, thus, the mold having a complementary shape with the convex part can be obtained. As for the microstructure according to the second aspect, a mold having the complementary shape with such a mold is fabricated based on the mold.

Next, the mold fabricated as above is filled with a polymer resin or the like forming the microstructure as described above and a shape pattern is transcribed thereto. Then, the polymer resin is cured and separated from the mold, and thus the microstructure having the microscopic structures including plural convex parts or concave parts incorporated can be obtained. Meanwhile, in the case of using the supporter, the mold is filled with the polymer resin or the like, the supporter is overlapped thereon, and the polymer resin or the like is cured and separated from the mold, so that the microstructure having the microscopic structures including the plural convex parts incorporated on the supporter can be obtained. Note that, in the case of forming the microstructure by the 2P method, the ionizing radiation curable resin is used, and, in the case of forming the microstructure by the 2T method or the emboss process method, the thermosetting resin or the thermoplastic resin is used.

Among the above transcription and incorporation techniques, the 2P method is preferable in that the microstructure can be fabricated in a relatively short time and heating and cooling are not necessary so that the thermal deformation of the component can be suppressed. Meanwhile, the 2T method is also preferable in that the degree of freedom in choosing the material of the member included in the microstructure is high and the process cost can be reduced.

As a method for curing the polymer resin, if the polymer resin is the ionizing radiation curable resin, the resin can be cured by the ionizing radiation. If the polymer resin is the thermosetting resin, the curing can be performed by heating. If the polymer resin is the thermoplastic resin, the curing can be performed by cooling. Here, the ionizing radial ray may be, for example, a UV ray with a wavelength region of 100 to 400 nm, preferably 200 to 400 nm, emitted from a super-high pressure mercury lamp, a high-pressure mercury lamp, a low-pressure mercury lamp, a carbon arc, a metal halide lamp, or the like, or an electron beam with a wavelength region of 100 nm or less emitted from a scanning • curtain type electron beam accelerator.

The microstructure for a light-emitting element according to the present disclosure has the uneven pattern determined by simulating the convex shape or the concave shape achieving the optimal luminous efficiency; therefore, the use of the microstructure for a light-emitting element can achieve excellent light extraction efficiency.

Next, a light-emitting element according to the present disclosure is described. The light-emitting element according to the present disclosure has a light-emitting unit in a light-transmitting member. More specifically, a reflection member for reflecting the light of the light-emitting unit includes the light-emitting unit, the light-transmitting member, and a light extraction member stacked in order. As the light-emitting device with such a configuration, specifically, an EL element, an LED element, and the like are given. An embodiment in which the present disclosure is applied to the EL element is hereinafter described.

An EL element according to the present disclosure includes a transparent anode, a light-emitting unit, and a cathode formed in this order, and a side of the transparent anode, which is opposite to the side thereof provided with the light-emitting unit, is provided with the microstructure for a light-emitting element according to the present disclosure so that the peak of the convex part (or opening face of the concave part) is on the light emission plane side. DC voltage is applied between the transparent anode and the cathode to inject the electrons and holes in the light-emitting unit, thereby generating the excitons through recombination of these. This makes the light-emitting unit emit light by utilizing the emission of light when the excitons are deactivated. The EL element may further include a hole transportation layer, a hole injection layer, an electron transportation layer, an electron injection layer, a glass substrate, or the like. Since these are conventionally known ones and may be provided as appropriate if necessary, the description of these is omitted here.

Figure 11:
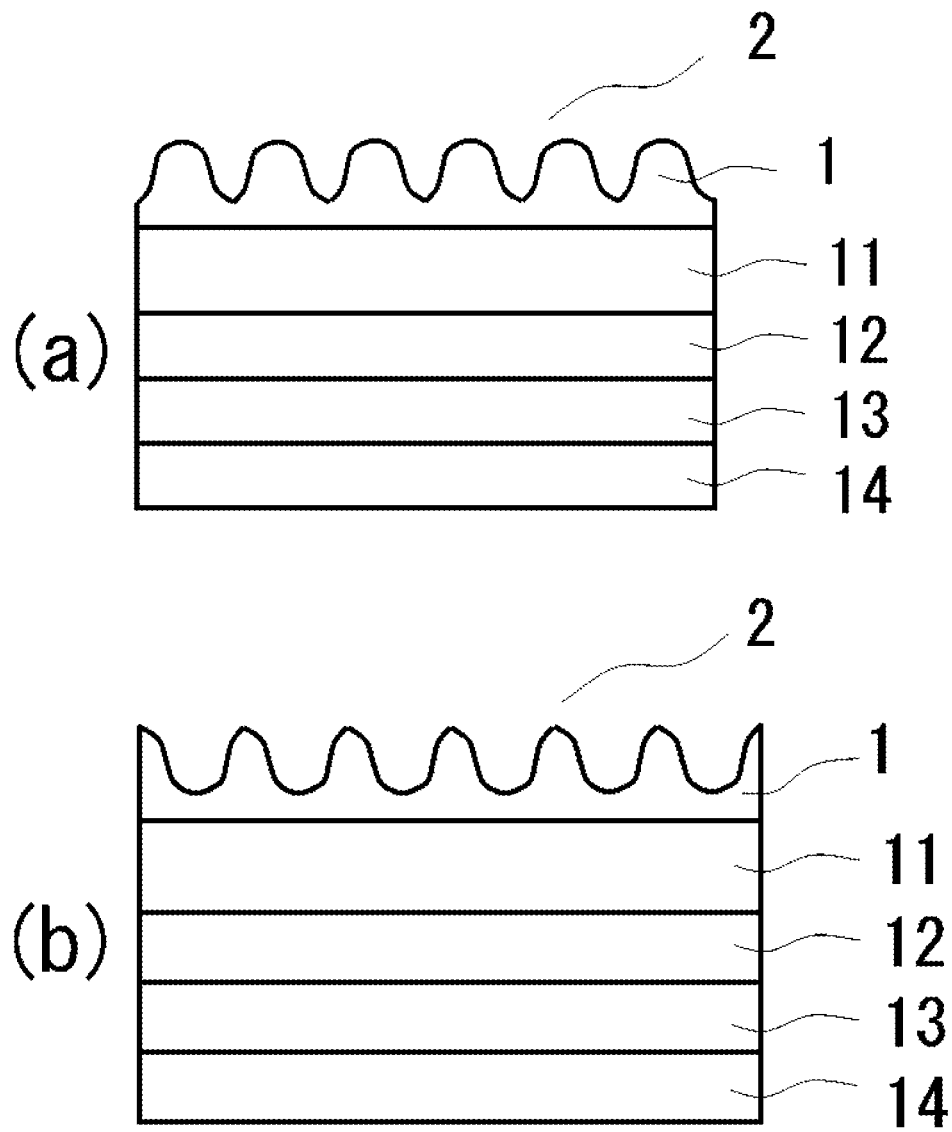
FIGS. 11(a) and 11(b) are schematic sectional views each depicting an embodiment of the light-emitting element according to the present disclosure.

FIG. 11 depict an EL element according to the present disclosure: FIG. 11(a) depicts a microstructure according to the first aspect; and FIG. 11(b) depicts a microstructure according to the second aspect. An EL element 2 according to the present disclosure includes a transparent anode 12, a light-emitting unit 13, and a cathode 14 formed in this order. A side of the transparent anode 12, which is opposite to the side thereof provided with the light-emitting unit 13, is provided with the microstructure 1 for an EL element so that the peak of the convex part or the opening face of the concave part is on the light emission plane side. Note that a glass substrate 11 may be provided on the transparent anode 12 in the EL element 2 as depicted in FIG. 11.

The transparent anode 12 is an electrode located on the light emission side of the both sides of the light-emitting unit. The cathode is located on the side of the light-emitting unit on the opposite side of the transparent anode.

The transparent anode 12 can be formed by an ITO film, an IZO film, or the like formed through a dry process such as a deposition method or a sputtering method. The deposition material is not limited thereto and another material can be used as long as the material is transparent and has electric conductivity.

The thickness of the transparent anode is preferably 1 μm or less. A thickness of 1 μm or less can prevent the local spike and moreover prevent deterioration in total light transmittance. If the local spike occurs and the height of its projection has reached 100 nm, for example, a problem might occur in a later deposition process.

The light-emitting unit 13 is a layer formed of a low-molecular or high-molecular EL material. Examples of the low-molecular EL material include a naphthalene derivative, an anthracene derivative, a perylene derivative, a pigment such as a polymethine pigment, a xanthene pigment, a coumarin pigment, or a cyanine pigment, a metal complex such as 8-hydroquinoline or its derivative, aromatic amine, a tetraphenylcyclopentadiene derivative, and the like. Examples of the high-molecular EL material include π-conjugated polymer materials such as PPV (polyparaphenylene vinylene), PAT (polythiophene), PF (polyfluorene), and PPP (polyparaphenylene). Depending on the EL material, the layer can be formed as a white-light-emitting layer or a light-emitting layer of blue, red, yellow, green or the like and these layers may be stacked.

For the cathode, metal with a small work function, such as Al (aluminum), In (indium), Mg (magnesium), Ti (titanium), Ag (silver), Ca (calcium), or Sr (strontium), an oxide or a fluoride of such a metal, an alloy thereof, a stack including any of these, or the like can be used.

The refractive index of the element included in the EL element is not particularly limited; for example, a layer included in the microstructure has a refractive index of 1.4 to 1.70, the glass has a refractive index of 1.45 to 1.80, the transparent electrode has a refractive index of 1.90 to 2.20, and the light-emitting unit has a refractive index of 1.50 to 1.90.

As thus described, the EL element according to the present disclosure has the transparent anode, the light-emitting unit, and the cathode formed in this order, and the transparent anode has the microstructure for a light-emitting element according to the present disclosure on the side of the anode opposite to the side thereof provided with the light-emitting unit so that the uneven pattern (the peak of the convex part or the opening part of the concave part) is on the light emission plane side. Thus, the light extraction efficiency can be improved as compared with that of the conventional EL element.

Moreover, the EL element according to the present disclosure can be used as a light source of an illumination device. By the use of the EL element according to the present disclosure as the light source of the illumination device, the illumination with excellent light extraction efficiency as compared with the conventional illumination can be achieved.

The description has been made of the embodiment in which the microstructure for a light-emitting element according to the present disclosure is applied to the EL element; however, the microstructure according to the present disclosure can be applied to a light-emitting element other than the EL element, such as an LED element with a configuration in which the LED is coated with a fluorescent body contained resin or a transparent resin by disposing the microstructure on a surface of the resin, thereby improving the light extraction efficiency.

EXAMPLES

The present disclosure will be further described with reference to examples. Note that "part" and "%" are used on a weight basis unless otherwise stated.

1. Fabrication of Microstructure
<Fabrication of Concave Mold>

Prepared were molds a to i (vertical×horizontal size is 10 mm×10 mm each) that can incorporate and transcribe a particular uneven shape formed by a fine drilling technique. The uneven shape of each mold was fabricated by bringing a concave part with an opening having a diameter of approximately 25 μm and a depth of approximately 20 μm into close contact at a predetermined filling factor (as noted elsewhere) and a concave part as a body of rotation of a generatrix was fabricated while the shape of the generatrix was varied depending on the mold.

Example 1

Into the mold a, a mixture solution including 50 parts of acrylic monomer (methyl methacrylate: Wako Pure Chemical Industries, Ltd.), 45 parts of multifunctional acrylic monomer (NK ester A-TMPT-3E0: Shin-Nakamura Chemical Co., Ltd.), and 5 parts of photopolymerization initiator (IRGACURE 184: Ciba Japan) was dropped as an UV ray curable resin, and a 100-μm-thick polyester film (COSMOSHINE A4300: TOYOBO CO., LTD.) was brought into close contact with the solution. While this state is maintained, the polyester film was irradiated with a UV ray with 1500 mJ/cm$^2$ from a metal halide lamp to cure the UV ray curable resin, and then the polyester film and the resin were separated from the mold. Thus, the microstructure according to Example 1 to which the shape of the mold has been faithfully transcribed was fabricated. This microstructure was provided with a base part of approximately 10 μm (corresponding to a thickness of t in FIG. 5) from the unevenness of the mold to the polyester film. Table 1 shows the results of measuring the configuration of the microstructure of Example 1 using a laser microscope (KEYENCE CORPORATION: VK-9500).

Examples 2 to 6 and Comparative Examples 1 to 3

Microstructures according to Examples 2 to 6 and Comparative Examples 1 to 3 were fabricated in a manner similar to Example 1 except that the molds b to i were used instead of the mold a used in Example 1. Table 1 shows the configurations of the microstructures according to Examples 2 to 6 and Comparative Examples 1 to 3. Note that the convex part of the microstructure of Comparative Example 1 is hemispherical.

TABLE 1

| | | Example 1 | Example 2 | Example 3 | Example 4 | Example 5 | Example 6 | Comparative Example 1 | Comparative Example 2 | Comparative Example 3 |
|---|---|---|---|---|---|---|---|---|---|---|
| configuration of microstructure | height of peak of convex part (times) | 0.9 | 1.04 | 1.11 | 1.15 | 0.90 | 0.90 | 1.00 | 0.90 | 0.84 |
| | height of convex part at 3/4 position (times) | 0.45 | 0.49 | 0.51 | 0.43 | 0.45 | 0.45 | 0.66 | 0.16 | 0.10 |
| | height of convex part at 9/10 position (times) | 0.14 | 0.12 | 0.22 | 0.09 | 0.14 | 0.14 | 0.43 | 0.03 | 0.02 |
| | height of convex part at 1/4 position (times) | 0.87 | 1.00 | 1.05 | 1.11 | 0.87 | 0.87 | 0.97 | 0.87 | 0.63 |
| | height of convex part at 1/2 position (times) | 0.75 | 0.85 | 0.86 | 0.95 | 0.75 | 0.75 | 0.86 | 0.69 | 0.33 |
| | filling factor of convex part (%) | 90 | 90 | 90 | 90 | 85 | 79 | 90 | 90 | 90 |

TABLE 1-continued

|  | Example 1 | Example 2 | Example 3 | Example 4 | Example 5 | Example 6 | Comparative Example 1 | Comparative Example 2 | Comparative Example 3 |
|---|---|---|---|---|---|---|---|---|---|
| angle at end of convex part (°) | 45 | 15 | 60 | 30 | 45 | 45 | 90 | 15 | 5 |

Note that, in Table 1, "height of peak of convex part" refers to the ratio of the height of the peak of the convex part to the radius of the bottom surface of the convex part. Moreover, "height of convex part at 3/4 position", "height of convex part at 9/10 position", "height of convex part at 1/4 position", and "height of convex part at 1/2 position" refer to the ratio of the height of the convex part to the radius of the bottom surface of the convex part at 3/4, 9/10, 1/4, and 1/2 positions of the radius of the bottom surface of the convex part from the center of the bottom surface of the convex part, respectively. Further, "filling factor of convex part" refers to the filling factor of the bottom surface of the convex part to the surface of the microstructure. In addition, "angle at end of convex part" refers to the angle between the tangential line of the generatrix of the convex part and the bottom surface of the convex part at the position where the bottom surface of the convex part and the generatrix of the convex part are in contact with each other (α in FIG. 4).

Example 7

A hard coat film (KB film N05S: KIMOTO CO., LTD.) including a hard coat layer and a polyester film was bonded to the convex surface of the microstructure of Example 1 with the polyester film side attached to the convex surface via an adhesive, thereby providing a microstructure according to Example 7.

<Fabrication of Convex Mold>

A board having a particular uneven shape formed by the fine drilling technique was fabricated in a manner similar to the fabrication of the concave mold. The uneven shape of the board was fabricated by bringing a concave part with an opening having a radius of approximately 25 μm and a depth of approximately 20 μm into close contact at a predetermined filling factor (as noted elsewhere), and by differing the shape of the generatrix of the concave shape depending on the board, the concave part as the body of rotation of the generatrix was fabricated. Next, the particular uneven shape was inverted by electroforming to prepare molds j to r (vertical × horizontal size is 10 mm × 10 mm each) that can incorporate and transcribe this shape.

Example 8

A mixture solution including 50 parts of acrylic monomer (methyl methacrylate: Wako Pure Chemical Industries, Ltd.), 45 parts of multifunctional acrylic monomer (NK ester A-TMPT-3E0: Shin-Nakamura Chemical Co., Ltd.), and 5 parts of photopolymerization initiator (IRGACURE 184: Ciba Japan) was dropped as an UV ray curable resin, and a 100-μm-thick polyester film (COSMOSHINE A4300: TOYOBO CO., LTD.) was brought into close contact with the solution. While this state is maintained, the polyester film was irradiated with a UV ray with 1500 mJ/cm² from a metal halide lamp to cure the UV ray curable resin, and then the polyester film and the resin were separated from the mold. Thus, the microstructure according to Example 8 to which the shape of the mold has been faithfully transcribed was fabricated. This microstructure was provided with a base part of approximately 10 μm (corresponding to a thickness of t in FIG. 8) from the bottom of the concave part transcribed by the mold to the polyester film surface. Table 2 shows the results of measuring the configuration of the microstructure of Example 8 using a laser microscope (KEYENCE CORPORATION: VK-9500).

Examples 9 to 13 and Comparative Examples 4 to 6

Microstructures according to Examples 9 to 13 and Comparative Examples 4 to 6 were fabricated in a manner similar to Example 8 except that the molds k to r fabricated by varying the uneven shape by the method similar to that of Example 8 were used instead of the mold j used in Example 8. Table 2 shows the results of measuring the configurations of the microstructures according to Examples 9 to 13 and Comparative Examples to 6 with a laser microscope (KEYENCE CORPORATION: VK-9500). Note that the hollow part of the concave part of the microstructure of Comparative Example 4 is hemispherical.

TABLE 2

|  |  | Example 8 | Example 9 | Example 10 | Example 11 | Example 12 | Example 13 | Comparative Example 4 | Comparative Example 5 | Comparative Example 6 |
|---|---|---|---|---|---|---|---|---|---|---|
| configuration of microstructure | depth of bottom of concave part (times) | 0.93 | 0.78 | 1.19 | 1.42 | 0.93 | 0.93 | 1.00 | 0.97 | 0.87 |
|  | depth of concave part at 3/4 position (times) | 0.39 | 0.44 | 0.59 | 0.52 | 0.39 | 0.39 | 0.66 | 0.82 | 0.06 |
|  | depth of concave part at 9/10 position (times) | 0.12 | 0.18 | 0.36 | 0.11 | 0.12 | 0.12 | 0.43 | 0.64 | 0.01 |
|  | depth of concave part at 1/4 position (times) | 0.91 | 0.76 | 1.15 | 1.38 | 0.91 | 0.91 | 0.97 | 0.96 | 0.59 |
|  | depth of concave part at 1/2 position (times) | 0.80 | 0.67 | 1.00 | 1.17 | 0.80 | 0.80 | 0.86 | 0.93 | 0.24 |
|  | filling factor of concave part (%) | 90 | 90 | 90 | 90 | 85 | 79 | 90 | 90 | 90 |

TABLE 2-continued

|  | Example 8 | Example 9 | Example 10 | Example 11 | Example 12 | Example 13 | Comparative Example 4 | Comparative Example 5 | Comparative Example 6 |
|---|---|---|---|---|---|---|---|---|---|
| angle at end of hollow part of concave part (°) | 45 | 45 | 75 | 30 | 45 | 45 | 90 | 90 | 5 |

Note that in Table 2, "depth of bottom of concave part" refers to the ratio of the depth of the bottom of the concave part to the radius of the opening face of the concave part. Moreover, "depth of concave part at 3/4 position", "depth of concave part at 9/10 position", "depth of concave part at 1/4 position", and "depth of concave part at 1/2 position" refer to the ratio of the depth of the concave part relative to the radius of the opening face of the concave part at 3/4, 9/10, 1/4, and 1/2 positions of the radius of the opening face of the concave part from the center of the opening face of the concave part, respectively. Further, "filling factor of concave part" refers to the filling factor of the opening face of the concave part to the surface of the microstructure. In addition, "angle of end of hollow part of concave part" refers to the angle between the tangential line of the generatrix of the concave part and the opening face of the concave part at the position where the opening face of the concave part and the generatrix of the concave part are in contact with each other (β in FIG. 7).

Example 14

A hard coat film (KB film N05S: KIMOTO CO., LTD.) including a hard coat layer and a polyester film was bonded to the opening face of the concave part of the microstructure of Example 8 with the polyester film side attached to the opening face via an adhesive, thereby providing a microstructure according to Example 14.

2. Evaluation

The microstructures of Examples 1 to 6 (first aspect), 8 to 13 (second aspect), and Comparative Examples 1 to 6 were attached onto the light emission plane of an organic EL light-emitting device manufactured by OSRAM GmbH to provide the organic EL light-emitting device. Next, a voltage of 3.5 V and a current of 120 mA were applied to the organic EL light-emitting device to make the device emit light; thus, all the light fluxes were measured and the power efficiency was calculated. For evaluating the microstructure of the first aspect, the percentage of change of the power efficiency of the microstructures of Examples 1 to 6 and Comparative Examples 2 and 3 to the power efficiency of the microstructure of Comparative Example 1 (efficiency change percentage (%)) was obtained. The results are shown in Table 3. For evaluating the microstructure of the second aspect, the percentage of change of the power efficiency of the microstructures of Examples 8 to 13 and Comparative Examples 4 to 6 to the power efficiency of the microstructure of Comparative Example 4 (efficiency change percentage (%)) was obtained. The results are shown in Table 4.

TABLE 3

|  | Efficiency change (to Comparative Example 1) (%) |
|---|---|
| Example 1 | 2.76 |
| Example 2 | 2.56 |
| Example 3 | 2.38 |
| Example 4 | 1.70 |
| Example 5 | 1.82 |
| Example 6 | 0.08 |
| Comparative Example 1 | 0.00 |
| Comparative Example 2 | −0.09 |
| Comparative Example 3 | −0.49 |

As indicated in Table 1 and Table 3, since the organic EL light-emitting device including the microstructure of the first aspect includes the microstructures of Examples 1 to 6 having the special convex part specified in the present disclosure, the light extraction efficiency is superior to that of the microstructure of Comparative Example 1.

In particular, the light extraction efficiency of the organic EL light-emitting device including the microstructures of Examples 1 to 3 and 5 and 6 are excellent because the microstructure satisfies not just the condition 1 but also the condition 2. Note that the efficiency change percentage of Example 6 relative to Comparative Example 1 is small; however, since the special convex part specified in the present disclosure is included, the light extraction efficiency is excellent as compared with the one having the same filling factor, which is not shown in the examples, and having the shape other than the special convex part specified in the present disclosure.

Moreover, in the organic EL light-emitting device including the microstructures of Examples 1 and 2, the filling factor of the bottom surface of the convex part occupied in the surface of the microstructure is 85% or more and the height of the peak of the convex part of the microstructure is 0.70 to 1.07 times as large as the radius of the bottom surface of the convex part, and the heights of the convex part at ¾, 9/10, ¼, and ½ positions of the radius of the bottom surface of the convex part from the center of the bottom surface of the convex part are 0.25 to 0.63 times, 0.05 to 0.35 times, 0.67 to 1.04 times, and 0.63 to 0.88 times as large as the radius of the bottom surface, respectively, which is the preferable range of the condition 1 and the condition 2. Thus, the light extraction efficiency is improved.

Moreover, in the organic EL light-emitting device including the microstructure of Example 1, the filling factor of the bottom surface of the convex part occupied in the surface of the microstructure is 85% or more and the height of the peak of the convex part of the microstructure is 0.80 to 1.00 times as large as the radius of the bottom surface of the convex part, and the heights of the convex part at ¾, 9/10, ¼, and ½ positions of the radius of the bottom surface of the convex part from the center of the bottom surface of the convex part are 0.37 to 0.53 times, 0.08 to 0.20 times, 0.77 to 0.93 times, and 0.66 to 0.83 times as large as the radius of the bottom surface, respectively, which is the more preferable range of the condition 1 and the condition 2. Thus, the light extraction efficiency is improved.

On the other hand, in the organic EL light-emitting device including the microstructure of Comparative Example 1, the shape of the convex part on the surface of the microstructure is hemispherical, which is different from that specified in the present disclosure. Therefore, the light extraction efficiency is inferior to that of the organic EL light-emitting device including the microstructure of Examples 1 to 6. Note that the organic EL light-emitting device including the microstructure of Comparative Example 1 has the power efficiency which is approximately equivalent to that of Example 6; this is because of the difference in filling factor of the convex part, and it is understood that the light extraction efficiency is inferior to that of Examples 1 to 4 with the same filing ratio.

Moreover, in the organic EL light-emitting device including the microstructure of Comparative Examples 2 and 3, the shape of the convex part occupied in the surface of the microstructure is also different from that specified in the present disclosure. Therefore, the light extraction efficiency is inferior to that of the organic EL light-emitting device including the microstructure of Examples 1 to 6.

TABLE 4

|  | Efficiency change (to Comparative Example 1) (%) |
| --- | --- |
| Example 8 | 1.59 |
| Example 9 | 1.09 |
| Example 10 | 0.47 |
| Example 11 | 0.45 |
| Example 12 | 0.92 |
| Example 13 | 0.23 |
| Comparative Example 4 | 0.00 |
| Comparative Example 5 | −1.27 |
| Comparative Example 6 | −3.35 |

As indicated in Table 2 and Table 4, in the organic EL light-emitting device including the microstructure of the second aspect, the microstructure of Examples 8 to 13 includes the special concave part specified in the present disclosure; therefore, the light extraction efficiency is superior to that of the microstructure of Comparative Example 4.

In particular, since the organic EL light-emitting device including the microstructure of Examples 8 to 10 and 12 and 13 has the microstructure satisfying not just the condition 3 but also the condition 4, the light extraction efficiency is more excellent. As for Example 13, although the efficiency change percentage relative to Comparative Example 4 is small, the inclusion of the special concave part specified in the present disclosure allows the excellent light extraction efficiency as compared with the one having the same filling factor, which is not shown in the examples, and having the shape other than the special concave part specified in the present disclosure.

Moreover, in the organic EL light-emitting device including the microstructures of Examples 8 and 9, the filling factor of the opening face of the concave part to the surface of the microstructure is 85% or more and the depth of the bottom of the concave part of the microstructure is 0.75 to 1.38 times as large as the radius of the opening face of the concave part, and the depths of the concave part at ¾, 9/10, ¼, and ½ positions of the radius of the opening face of the concave part from the center of the opening face of the concave part are 0.24 to 0.58 times, 0.04 to 0.28 times, 0.74 to 1.25 times, and 0.65 to 0.97 times as large as the radius of the opening face, respectively, which is the preferable range of the condition 3 and the condition 4. Thus, the light extraction efficiency is improved.

Moreover, in the organic EL light-emitting device including the microstructure of Example 8, the filling factor of the opening face of the concave part to the surface of the microstructure is 85% or more and the depth of the bottom of the concave part of the microstructure is 0.81 to 1.25 times as large as the radius of the opening face of the concave part, and the depths of the concave part at ¾, 9/10, ¼, and ½ positions of the radius of the opening face from the center of the opening face of the concave part are 0.34 to 0.53 times, 0.07 to 0.23 times, 0.78 to 1.17 times, and 0.67 to 0.95 times as large as the radius of the opening face, respectively, which is the more preferable range of the condition 3 and the condition 4. Thus, the light extraction efficiency is improved.

On the other hand, in the organic EL light-emitting device including the microstructure of Comparative Example 4, the shape of the concave part occupied in the surface of the microstructure is hemispherical, which is different from that specified in the present disclosure. Therefore, the light extraction efficiency is inferior to that of the organic EL light-emitting device including the microstructure of Examples 8 to 13. Note that the organic EL light-emitting device including the microstructure of Comparative Example 4 has the power efficiency which is approximately equivalent to that of Example 13; this is because of the difference in filling factor of the concave part, and it is understood that the light extraction efficiency is inferior to that of Examples 8 to 11 with the same filling factor.

Moreover, in the organic EL light-emitting device including the microstructure of Comparative Examples 5 and 6, the shape of the concave part occupied in the surface of the microstructure is also different from that specified in the present disclosure. Therefore, the light extraction efficiency is inferior to that of the organic EL light-emitting device including the microstructure of Examples 8 to 13. As a result of scratching the surface of the microstructure of Examples 8 to 13 with a nail, it was confirmed that the microstructure was not damaged and its surface hardly allowed the scratch.

3. Evaluation of Example 7 and Example 14

In a manner similar to the above description, the microstructures of Example 7 and Example 14 were attached onto the light emission plane of the organic EL light-emitting device manufactured by OSRAM GmbH to provide the organic EL light-emitting device. Next, a voltage of 3.5 V and a current of 120 mA were applied to the organic EL light-emitting device to make the device emit light; thus, all the light fluxes were measured and the power efficiency was calculated. The percentage of change of the power efficiency of the microstructure of Example 7 to the power efficiency of the microstructure of Comparative Example 1 (efficiency change percentage (%)) was 2.62%. The percentage of change of the power efficiency of the microstructure of Example 14 to the power efficiency of the microstructure of Comparative Example 4 (efficiency change percentage (%)) was 1.51%.

As indicated by the above measurement results, since the organic EL light-emitting device including the microstructure of Example 7 includes the special convex part specified in the present disclosure, the light extraction efficiency is excellent. Moreover, since the organic EL light-emitting device including the microstructure of Example 14 includes the special concave part specified in the present disclosure, the light extraction efficiency is excellent.

The outermost surface of the microstructure of Example 7 and Example 14 on the side thereof provided with the convex part was subjected to pencil scratching hardness test based on JIS K5400: 1990 so that the pencil hardness was measured using HEIDON-14 (SHINTO Scientific Co., ltd.), and it was confirmed that the pencil hardness thereof was 2H and the scratch prevention properties were excellent. Moreover, the dust and fingerprint on the outermost surface of the microstructure of Example 7 and Example 14 on the side thereof provided with the convex part were easily removed without damaging the surface by wiping the outermost surface with rag.

The invention claimed is:

1. A microstructure for a light-emitting element, comprising a plurality of microscopic convex parts each having a circular bottom surface, wherein the convex part has a peak on a perpendicular line at a center of the bottom surface and is defined by a generatrix connecting the peak and a circumference of the bottom surface, the generatrix of the convex part is formed by monotonically reducing height from the peak to the circumference of the bottom surface, the height of the peak of the convex part is 0.67 to 1.15 times as large as a radius of the bottom surface, the height of the convex part at a position of ¾ of the radius of the bottom surface from the center of the bottom surface is 0.21 to 0.65 times as large as the radius of the bottom surface, and the height of the convex part at a position of 9/10 of the radius of the bottom surface from the center of the bottom surface is 0.04 to 0.38 times as large as the radius of the bottom surface.

2. The microstructure for a light-emitting element according to claim 1, wherein the height of the convex part at a position of ¼ of the radius of the bottom surface from the center of the bottom surface is 0.65 to 1.08 times as large as the radius of the bottom surface, and the height of the convex part at a position of ½ of the radius of the bottom surface from the center of the bottom surface is 0.58 to 0.91 times as large as the radius of the bottom surface.

3. The microstructure for a light-emitting element according to claim 1, wherein a filling factor of the bottom surface of the convex part to a surface of the microstructure is 70% or more.

4. The microstructure for a light-emitting element according to claim 1, wherein a filling factor of the bottom surface of the convex part to a surface of the microstructure is 80% or more.

5. The microstructure for a light-emitting element according to claim 1, wherein an angle between a tangential line of the generatrix of the convex part and the bottom surface of the convex part at a position where the bottom surface of the convex part and the generatrix of the convex part are in contact with each other, and the generatrix of the concave part are in contact with each other is 85° or less.

6. The microstructure for a light-emitting element according to claim 1, wherein a member with a flat surface is disposed on a surface provided with the convex part.

7. A light-emitting device comprising a reflection member, a light-emitting unit, a light-transmitting member, and a light extraction member provided in order, wherein the microstructure for a light-emitting element according to claim 1 is used as the light extraction member.

8. An EL element comprising a transparent anode, a light-emitting unit, and a cathode provided in order, wherein the microstructure for a light-emitting element according to claim 1 is disposed on a side of the transparent anode opposite to a side thereof provided with the light-emitting unit, so that the peak of the convex part is on a light emission plane side.

9. An illumination device comprising the light-emitting element according to claim 7 as a light source.

10. An illumination device comprising the EL element according to claim 8 as a light source.

* * * * *